United States Patent [19]

Fukuzo

[11] Patent Number: 5,341,341
[45] Date of Patent: Aug. 23, 1994

[54] DYNAMIC RANDOM ACCESS MEMORY DEVICE HAVING ADDRESSING SECTION AND/OR DATA TRANSFERRING PATH ARRANGED IN PIPELINE ARCHITECTURE

[75] Inventor: Yukio Fukuzo, Tokyo, Japan
[73] Assignee: NEC Corporation, Tokyo, Japan
[21] Appl. No.: 36,031
[22] Filed: Mar. 23, 1993

[30] Foreign Application Priority Data

Mar. 26, 1992 [JP] Japan .................. 4-067795

[51] Int. Cl.$^5$ .................................. G11C 8/00
[52] U.S. Cl. .................. 365/233; 365/189.05; 365/230.08
[58] Field of Search ............... 365/233, 230.08, 189.05

[56] References Cited

U.S. PATENT DOCUMENTS 4,986,666  1/1991  Homma ................... 365/189.05
5,086,414  2/1992  Nambu .................... 365/233

FOREIGN PATENT DOCUMENTS 137294  6/1986  Japan ................... 365/189.05
 72394  3/1989  Japan ................... 365/189.05

Primary Examiner—William L. Sikes
Assistant Examiner—Tiep Nguyen
Attorney, Agent, or Firm—Sughrue, Mion, Zinn, Macpeak & Seas

[57] ABSTRACT

A dynamic random access memory device is responsive to a row address signal and a column address signal supplied in synchronism with a system clock signal for providing a data path from a data input/output port and a memory cell selected from the memory cell array, and latch circuits are provided in the addressing section and the data transferring path for temporarily storing address decoded signal and write-in and read-out data bits in response to latch control signals higher in frequency than the system clock signal, thereby controlling the data stream in a pipeline fashion.

6 Claims, 6 Drawing Sheets

DYNAMIC RANDOM ACCESS MEMORY DEVICE HAVING ADDRESSING SECTION AND/OR DATA TRANSFERRING PATH ARRANGED IN PIPELINE ARCHITECTURE

FIELD OF THE INVENTION

This invention relates to a dynamic random access memory device and, more particularly, to a dynamic random access memory device responsive to a high speed central processing unit such as a microprocessor equipped with a reduced instruction set.

DESCRIPTION OF THE RELATED ART

A typical example of the dynamic random access memory device is illustrated in FIG. 1, and is, by way of example, communicable with a central processing unit (not shown) through an address port 1, an input data pin 2 and an output data pin 3. The prior art random access memory device selectively enters a read-out mode and a write-in mode of operation, and a read-out sequence and a write-in sequence proceeds in synchronism with a system clock CLK at a clock pin 4.

While the prior art dynamic random access memory device stays in the read-out mode, the central processing unit is accessible to a data bit stored in the dynamic random access memory device, and supplies a row address signal ADDr and a column address signal ADDc to the address port 1 in a time division multiplex fashion. The dynamic random access memory device sequentially produces an internal row address strobe signal NRAS at a timing generating stage G1 and an internal column address strobe signal NCAS at a timing generating stage G2, and the row address signal ADDr and the column address signal ADDc are respectively stored in a row address latch circuit 5 and a column address latch circuit 6. The row address signal ADDr and the column address signal ADDc are respectively transferred from the row address latch circuit 5 and the column address latch circuit 6 to a row address buffer circuit 7 and a column address buffer circuit 8, and the row address signal ADDr and the column address signal ADDc are predecoded thereat so that a row address predecoded signal ADDPr and a column address predecoded signal ADDPc are supplied to a row address decoder circuit 9 and a column address decoder circuit 10, respectively. The row address decoder circuit 9 and the column address decoder circuit 10 respectively produce a row address decoded signal Drow and a column address decoded signal Dcol from the row address predecoded signal ADDPr and the column address predecoded signal ADDPc, and driver circuits 11 and 12 are responsive to the row address decoded signal Drow and the column address decoded signal Dcol for selecting a row of memory cells and a column of memory cells from a memory cell array 13.

The memory cell array 13 is arranged in rows and columns, and word lines WL1 to WLm and bit line pairs BL1 to BLn are associated with the rows and the columns. Each bit line pairs BL1 to BLn consists of left and right bit lines BLa and BLb, and the columns are alternately coupled with the left and right bit lines BLa and BLb.

If the row and column address signals ADDr and ADDc are indicative of a memory cell M11, the driver circuit 11 drives the word line WL1 to active level, and data bits are read out from the first row including the memory cell M11 to the left bit lines BLa. The data bits are supplied to an array 14 of sense amplifier circuits SA1 to SAn, and small differential voltages indicative of the read-out data bits are developed so as to discriminate logic levels of the data bits.

The driver circuit 12 drives one of the decoded signal lines 12a, and a column selector circuit 15 couples one of the sense amplifier circuits SA1 to SAn with a data bus BUS. As a result, the data bit read out from the memory cell M11 is supplied through the data bus BUS to a read-out amplifier circuit 16, and the read-out amplifier circuit 16 increases the magnitude of the differential voltage indicative of the data bit read out from the memory cell Mll again. An output data buffer circuit 17 produces an output data signal indicative of the data bit from the differential voltage, and supplies the output data signal to the output data pin 3.

If the central processing unit requests the dynamic random access memory device to store a new data bit in, for example, the memory cell M11, the dynamic random access memory device enters the write-in mode, and the row address signal ADDr and the column address signal ADDc allow the word line WL1 and the column selector circuit I 5 to establish a path from the data bus BUS to the memory cell M11 in a similar manner to the read-out mode. A input data signal indicative of the new data bit is supplied to the input data pin 2, and is stored in a data latch circuit 18 in synchronism with an internal latch control signal CTL produced at a timing control stage G3 in response to the system clock signal CLK. A write-in data buffer circuit 19 produces differential voltage indicative of the input data signal, and the differential voltage is developed by a write-in amplifier circuit 20. The differential voltage thus developed is transferred through the data bus BUS and the column selector circuit 15 to the sense amplifier circuit SA1, and the differential voltage is increased in magnitude by the sense amplifier circuit SA1 again. The differential voltage is propagated through the bit line pair BL1, and either high or low voltage level is stored in the memory cell M11.

Thus, the prior art dynamic random access memory device internally produces the internal row address strobe signal NRAS and the internal column address strobe signal NCAS for the read-out mode and the internal latch control signal CTL for the write-in mode, and the component circuits 5 to 17 or the component circuits 5 to 15 and 18 to 20 sequentially activated for the read-out operation or the write-in operation.

In general, a central processing unit is fully involved in a sequence from a fetch of an instruction code to completion of the job indicated by the instruction code. However, the central processing unit sometimes stands idle, and the central processing unit in idle state is available for an advanced control (see "KYORITSU COMPUTER DICTIONARY 3rd Edition", edited by Hideo Yamashita/Comprehensive Laboratory of Univac Japan Corporation Limited, page 706, January 1990). In order to achieve the advanced control, an overlapping system is well known, and a central processing unit is associated with a plurality of memory units each referred to as "bank". In the overlapping system, a switching array is assumed be provided between the central processing unit and the memory units, and the central processing unit selectively accesses to the memory units or the banks. If the banks are coupled with one another, adjacent banks are assigned different addresses, and the address assignment is known as "Inter-leave"

(see page 714 of KYORITSU COMPUTER DICTIONARY). The advanced control is continuously developed, and the development efforts result in a pipe-line technology practically applied to a super computer system.

A system clock is getting higher and higher. In fact, a CISC type microprocessor such as Intel i-486/586 is responsive to a system clock at 50 MHz to 100 MHz, and a RISC type microprocessor such as R4000 of MIPS Corporation is responsive to a system clock at 70 MHz to 150 MHz with a primary cache.

On the other hand, the dynamic random access memory device is increased in integration density through miniaturization of circuit components, and a new technology such as a page mode access technique, a nibble mode access technique or a static column mode access technique is applied to the dynamic random access memory device for responding to short access time. The new technology is described in "LSI Handbook", edited by Electronic Communication Society, November 1984, page 492.

An advanced microprocessor equipped with a reduced instruction set achieves a job in synchronism with a system clock higher than 100 MHz, and expects the dynamic random access memory device to be accessed at 10 nanosecond to 15 nanosecond. However, the access time of the prior art high-speed dynamic random access memory device ranges between 50 nanosecond and 60 nanosecond, and such a long access time does not allow a high-speed microprocessor to directly access the prior art dynamic random access memory device. In order to fill the gap, the high-speed microprocessor requests a memory hierarchy, and a cache memory fabricated from high-speed bipolar transistors is inserted between the high-speed microprocessor and the prior art dynamic random access memory devices forming in combination a main storage. The memory hierarchy is complex and costy, and the system designer is eager for a high-speed dynamic random access memory device directly accessible at 10 nanosecond to 15 nanosecond.

SUMMARY OF THE INVENTION

It is therefore an important object of the present invention to provide a dynamic random access memory device which allows a high-speed microprocessor to access stored data without any cache memory.

To accomplish the object, the present invention proposes to arrange an addressing section and a data transferring path in accordance with a pipeline architecture.

In accordance with one aspect of the present invention, there is provided a dynamic random access memory device fabricated on a semiconductor chip, comprising: a) a memory cell array having a plurality of memory cells arranged in rows and columns, row addresses and column addresses being respectively assigned to the rows and the columns; b) a row addressing means having a row address latch circuit responsive to an internal row address strobe signal for temporarily storing an external row address signal, a row address decoder unit for producing a row address decoded signal from the external row address signal, and a word line driver circuit responsive to the row address decoded signal for selecting a row of memory cells indicated by the external row address signal; c) a column addressing means having a column address latch circuit responsive to an internal column address strobe signal for temporarily storing an external column address signal, a column address decoder unit for producing an internal column address decoded signal from the external column address signal, and a column selecting unit responsive to the column address decoded signal for selecting a column of memory cells indicated by the external column address signal; d) a data transferring means inserted between a data input/output port and the memory cell array for providing a data path between the data input/output port and one of the plurality of memory cells indicated by the external row address signal and the external column address signal, and having a first temporary data storage coupled with the data input/output port and responsive to a first control signal for storing an external data signal, a second temporary data storage responsive to a second control signal for storing a first differential voltage produced from the external data signal and a third temporary data storage responsive to a third control signal for storing a second differential voltage indicative of a read-out data bit supplied from the memory cell array; and e) a controlling means having a plurality of timing generating stages operative to produce the internal row address strobe signal, the internal column address strobe signal, the first control signal, the second control signal and the third control signal in synchronism with an external clock signal.

In accordance with another aspect of the present invention, there is provided a computer system controlled by a system clock signal, comprising: a) a dynamic random access memory device comprising a-1) a memory cell array having a plurality of memory cells arranged in rows and columns, row addresses and column addresses being respectively assigned to the rows and the columns; a-2) a row addressing means having a row address latch circuit responsive to an internal row address strobe signal for temporarily storing an external row address signal, a row address decoder unit for producing a row address decoded signal from the external row address signal, a first temporary address storage responsive to a first control signal for storing the row address decoded signal, and a word line driver circuit responsive to the row address decoded signal for selecting a row of memory cells indicated by the external row address signal, a-3) a column addressing means having a column address latch circuit responsive to an internal column address strobe signal for temporarily storing an external column address signal, a column address decoder unit for producing an internal column address decoded signal from the external column address signal, a second temporary address storage responsive to a second control signal for storing the column address decoded signal, and a column selecting unit responsive to the column address decoded signal for selecting a column of memory cells indicated by the external column address signal, a-4) a data transferring means inserted between a data input/output port and the memory cell array for providing a data path between the data input/output port and one of the plurality of memory cells indicated by the row address signal and the column address signal, and having a first temporary data storage coupled with the data input/output port and responsive to a third control signal for storing an external data signal, a second temporary data storage responsive to a fourth control signal for storing a first differential voltage produced from the external data signal and a third temporary data storage responsive to a fifth control signal for storing a second differential voltage indicative of a read-out data bit supplied from the memory cell array, and a-5) a controlling means having a plurality of timing generating stages operative to produce the internal row address strobe signal, the internal column address strobe signal, the first control signal, the second control signal, the third control signal, the fourth control signal and the fifth control signal in synchronism with the system clock signal, and a programing circuit responsive to an external command signal for disabling the timing generating stages operative to produce the first and second control signals or the timing generating stages operative to produce the first to fifth control signals; and b) a microprocessor communicable with the dynamic random access memory device, and having at least a read-out cycle for fetching a data bit stored in the memory cell array and a write-in cycle for rewriting a data bit stored in the memory cell array, the system clock signal defining the read-out cycle and the write-in cycle.

BRIEF DESCRIPTION OF THE DRAWINGS

The features and advantages of the high-speed dynamic random access memory device according to the present invention will be more clearly understood from the following description taken in conjunction with the accompanying drawings in which.

DESCRIPTION OF THE PREFERRED EMBODIMENTS

First Embodiment

Figure 1:
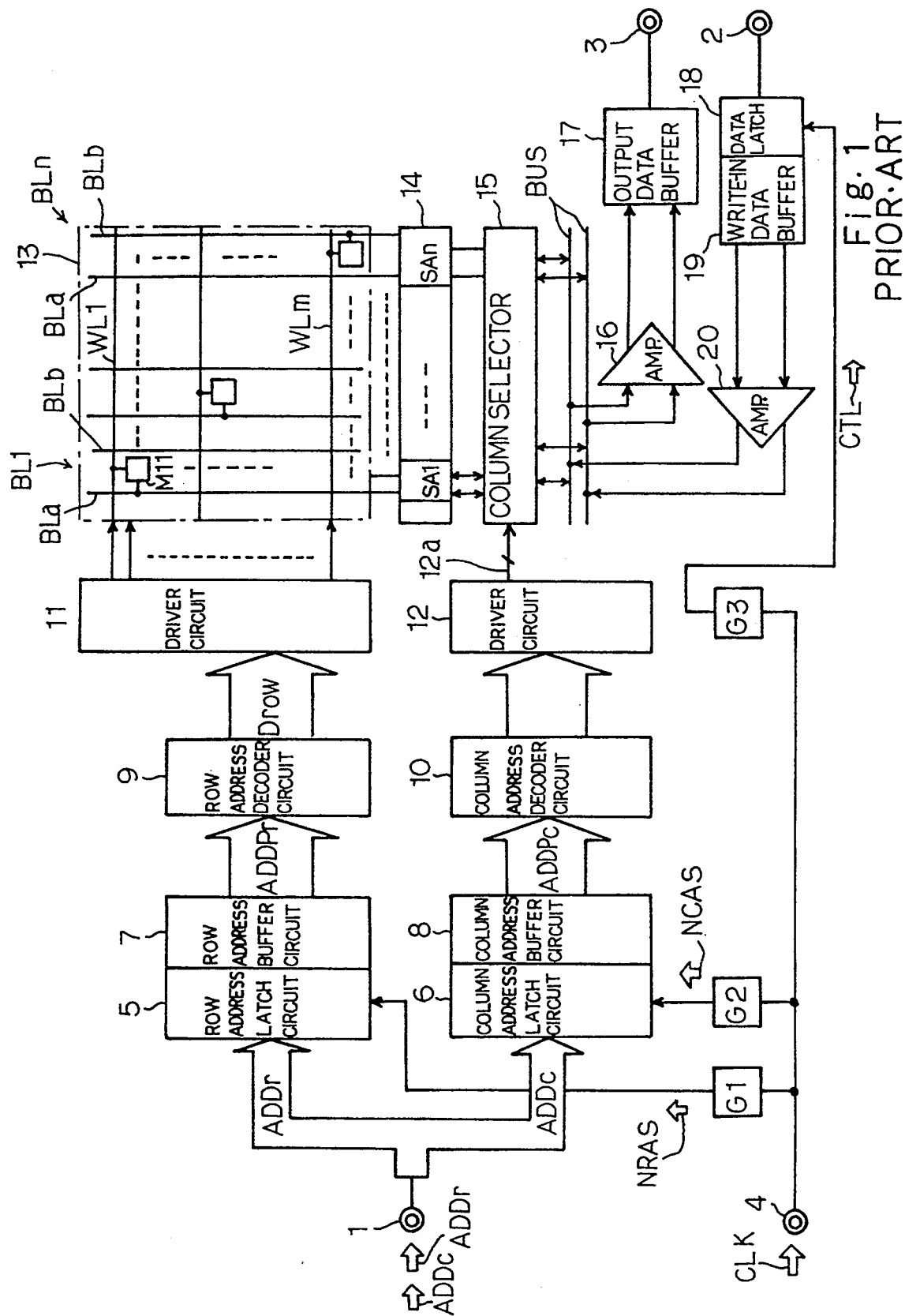
FIG. 1 is a block diagram showing the arrangement of the prior art dynamic random access memory device.
Figure 2:
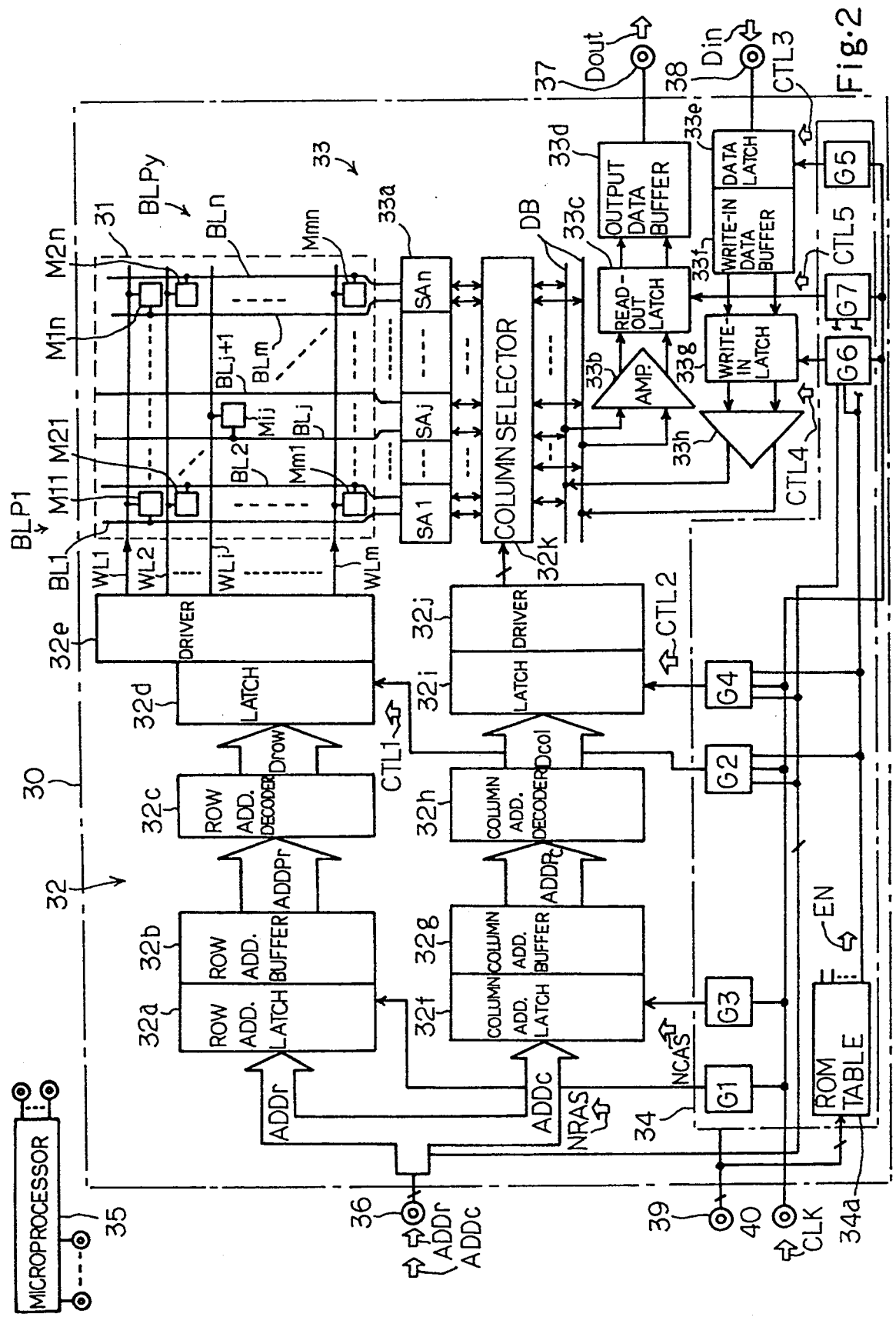
FIG. 2 is a block diagram showing a high-speed dynamic random access memory device according to the present invention.

Referring to FIG. 2 of the drawings, a high-speed dynamic random access memory device embodying the present invention is fabricated on a semiconductor chip 30, and largely comprises a memory cell array 31, an addressing means 32, a data transferring means 33 and a controller 34. The high-speed dynamic random access memory device forms a part of a data storage of a computer system, and is directly communicable with a high-speed microprocessor 35 equipped with a reduced instruction set directly through an address port 36, a data output port 37, a data input port 38, a control signal port 39 and a clock port 40. A row address signal ADDr and a column address signal ADDc are supplied to the address port 36 in a time division multiplex manner, and various external control signals such as a chip select signal and a write enable signal are supplied to the control port 39. With the external control signals, the controller 34 allows the high-speed dynamic random access memory device to selectively enter a write-in mode, a read-out mode, a refresh mode of operation and a programming mode. In the read-out mode, an output data signal Dour is supplied from the data output port 37, and an input data signal Din is supplied to the data input port 38 in the write-in mode. When the high-speed dynamic random access memory device enters the programming mode, the sequences of the addressing means 32 and the data transferring means 33 are divisible depending upon the frequency of a system clock signal CLK at the clock port 40 as will be understood hereinlater. The system clock signal CLK defines write-in and read-out cycles of the microprocessor 35. In this instance, the system clock signal CLK is adjustable to one of 33.3 MHz, 66.6 MHz and 100 MHz. The system clock signal at 33.3 MHz, at 66.6 MHz and at 100 MHz are hereinbelow indicated as CLK(1$f$), CLK(2$f$) and CLK(3$f$), respectively.

The memory cell array 31 is fabricated from a plurality of memory cells M11, M1n, M21, M2n, Mij, Mm1 and Mmn, and the plurality of memory cells M11 to Mmn are arranged in rows and columns. Each of the plurality of memory cells M11 to Mmn is implemented by a series combination of a switching transistor and a storage capacitor, and stores a data bit in the form of electric charges.

The addressing means 32 is operative to select a memory cell from the memory cell array 31, and is broken down into a row selecting sub-system and a column selecting sub-system. The row selecting sub-system selects a row of memory cells from the memory cell array 31, and comprises a row address latch circuit 32$a$, a row address buffer circuit 32$b$, a row address decoder circuit 32$c$, a latch circuit 32$d$, a word line driver circuit 32$e$ and word lines WL1, WL2, WLi and WLm.

The row address latch circuit 32$a$ is coupled with the address port 36, and is controlled by a timing generating stage G1 of the controller 34. Namely, the row address latch circuit 32$a$ is responsive to an internal row address strobe signal NRAS variable in synchronism with the system clock signal CLK, and the row address signal ADDr is latched by the row address latch circuit 32$a$ in the presence of the internal row address strobe signal NRAS. The row address latch circuit 32$a$ relays the row address signal ADDr to the row address buffer circuit 32$b$, and the row address buffer circuit 32$b$ produces row address predecoded signals ADDPt. The row address predecoded signals ADDPr is supplied to the row address decoder circuit 32$c$, and the row address decoder circuit 32$c$ produces a row address decoded signal Drow indicative of one of the rows of the memory cell array 31. The row address decoded signal Drow is supplied to the latch circuit 32$d$.

The latch circuit 32$d$ is newly added to the row selecting sub-system in accordance with the present invention, and is controlled by a timing generating stage G2 of the controller 34. If the timing generating stage G2 produces a timing control signal CTL1, and the latch circuit 32$d$ is responsive to the timing control signal CTL1 for temporarily storing the row address decoded signal Drow. The row address decoded signal Drow thus latched is transferred to the word line driver circuit 32$e$, and the word line driver circuit 32$e$ drives one of the word lines WL1 to WLm assigned the row address indicated by the row address signal ADDr to active level. However, if the timing generating stage G2 does not produces any latch control signal CTL1, the row address decoded signal Drow is directly supplied to the word line driver circuit 32$e$ without storing in the latch circuit 32$d$. The word lines WL1 to WLm are coupled with the gate electrodes of the switching transistors in the associated rows, and the row of memory cells coupled with the selected word line are coupled with the data transferring means 33.

The column selecting sub-system is operative to select a column of memory cells from the memory cell array 31, and comprises a column address latch circuit 32f, a column address buffer circuit 32g, a column address decoder circuit 32h, a latch circuit 32i, a driver circuit 32j and a column selector circuit 32k.

As described hereinbefore, the column address signal ADDc is supplied to the address port 36 in the multiplex manner, and the column address signal ADDc is latched by the column address latch circuit 32f under the control of a timing generating stage G3 of the controller 34. Namely, the timing generating stage G3 produces an internal column address strobe signal NCAS variable in synchronism with the system clock signal CLK, and the column address latch circuit 32f stores the column address signal ADDc in the presence of the internal column address strobe signal NCAS. The column address latch circuit 32f relays the column address signal ADDc to the column address buffer circuit 32g, and the column address buffer circuit 32g produces column address predecoded signals ADDPc from the column address signal ADDc. The column address predecoded signals ADDPc are supplied to the column address decoder circuit 32h, and column address decoder circuit 32h produces a column address decoded signal Dcol indicative of one of the columns of the memory cell array 31.

The latch circuit 32i is also newly added to the column selecting sub-system, and is under the control of a timing generating stage G4. Namely, if the timing generating stage G4 produces a latch control circuit CTL2, and the latch circuit 32i stores the column address decoded signal Dcol in the presence of the latch control signal CTL2. However, if the timing generating stage G4 does not produce any latch control signal CTL2, the column address decoded signal Dcol is directly supplied to the driver circuit 32j, and is not stored in the latch circuit 32i. The column selector 32k is implemented by a plurality of transfer gate units, and each of the transfer gate units is associated with every two columns of memory cells. The latch circuit 32i relays the column address decoded signal Dcol to the driver circuit 32j, and the driver circuit 32j allows one of the transfer gate units to turn on.

The data transferring means 33 is operative to transfer a data bit between either input or output port 38 or 37 and the memory cell array 31, and comprises a plurality of bit lines BL1, BL2, BLj, BLj+1, BLm and BLn, a sense amplifier array 33a, a data bus DB, a read amplifier circuit 33b, a read-out latch circuit 33c, an output data buffer circuit 33d, an input data latch circuit 33e, a write-in data buffer 33f, a write-in latch circuit 33g and a write-in amplifier circuit 33h. The read-out latch circuit 33c and the write-in latch circuit 33g are newly added to the data transfer means 33.

Every adjacent two bit lines are paired with each other, and a plurality of bit line pairs BLP1 to BLPy are provided for the columns of the memory cell array 31. The bit lines BL1 to BLn are respectively associated with the columns of the memory cell array 31, and are coupled with the drain nodes of the switching transistors in the associated columns. For example, the bit lines BL1 and BL2 are respectively associated with the column of the memory cells M11 to Mm-11 and the column of the memory cells M21 to Mm1, and, accordingly, the bit line pair BLP1 is associated with adjacent two columns of the memory cells 31. Though not shown in FIG. 2, the bit line pairs BL1 to BLy are coupled with a precharging circuit, and every adjacent two bit lines are charged and equalized at a middle voltage level between high and low voltage levels corresponding to logic "1" level and logic "0" level before one of the word lines is driven to the active level. When a word line is driven to the active level, every other bit line is coupled with the storage capacitor of the associated memory cell, and small differential voltages are produced on the bit line pairs BLP1 to BLPy in the read-out mode. On the other hand, each of the bit line pairs BLP1 to BLPy supplies either high or low voltage level to the storage capacitor of the associated memory cell in the write-in mode and the refresh mode of operation.

The sense amplifier circuit array 33a has a plurality of sense amplifier circuits SA1, SAj and SAn which are respectively coupled with the bit line pairs BL1 to BLPy. The sense amplifier circuits SA1 to SAn are concurrently activated so that small differential voltages are developed. As described hereinbefore, the column selector 32k couples one of the bit line pairs BLP1 to BLPy with the data bus DB, and differential voltage is transferred between the sense amplifier circuit array 33a and the data bus DB. While the high speed dynamic random access memory device is in the read-out mode, one of the differential voltages is supplied from the column selector 32k through the data bus DB to the read-out amplifier circuit 33b. On the other hand, if the high-speed dynamic random access memory device enters the write-in mode, differential voltage indicative of a write-in data bit is supplied from the write-in amplifier circuit 33h through the data bus DB to the column selector 32k.

The read-out amplifier circuit 33b supplies the differential voltage through the read-out latch circuit 33c to the output data buffer circuit 33d, and the output data buffer circuit 33d supplies the output data signal Dour indicative of the read-out data bit to the output data port 37 in the read-out mode. On the other hand, while staying in the write-in mode, the input data signal Din is temporally stored in the data latch circuit 33e in response to a latch control signal CTL3 supplied from a timing generating stage G5, and the write-in data buffer circuit 33f produces the differential voltage indicative of the write-in data bit from the input data signal Din. The write-in data buffer circuit 33f supplies the differential voltage through the write-in latch circuit 33g to the write-in amplifier circuit 33h.

The write-in latch circuit 33g and the read-out latch circuit 33c newly added are under the control of timing generating stages G6 and G7 of the controller 34. Namely, if the timing generating stages G6 and G7 produce latch control signals CTL4 and CTL5, and the write-in latch circuit 33g and the read-out latch circuit 33c are respectively responsive to the latch control signals CTL4 and CTL5 for storing the differential voltage from the write-in data buffer circuit 33f and from the read-out amplifier circuit 33b. However, if the latch control signals CTL4 and CTL5 are not produced, the write-in latch circuit 33g and the read-out latch circuit 33c are disabled, and the differential voltages are directly transferred between the write-in data buffer circuit 33f and the write-in amplifier circuit 33h and between the read-out amplifier circuit 33b and the output data buffer circuit 33d.

In summary, the latch circuits 32d and 32i, the read-out and write-in latch circuits 33c and 33g and the timing generating stages G2, G4, G6 and G7 are newly added to the arrangement of the prior art dynamic random access memory device. The latch circuits 32d, 32i, 33c and 33g are implemented by flip flop circuits, respectively, and are selectively enabled for dividing the sequence of the addressing means 32 and the sequence of the data transferring means 33.

Figure 3:
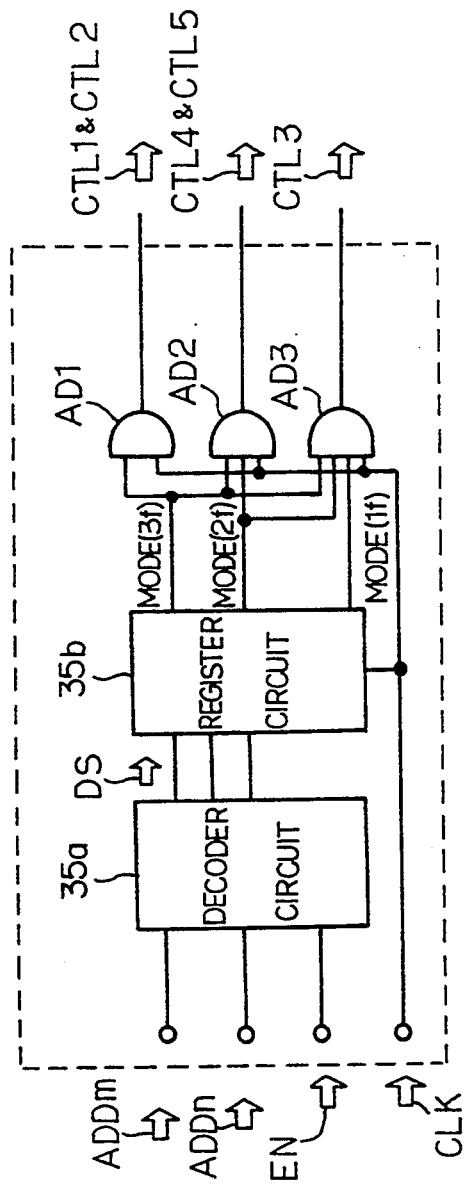
FIG. 3 is a circuit diagram showing the arrangement of a timing generating stage incorporated in the high-speed dynamic random access memory device.

FIG. 3 illustrates an equivalent circuit to the timing generating stages G2 and G4, to G7, and the equivalent circuit comprises a decoder circuit 35a, a register circuit 35b and three AND gates AD1, AD2 and AD3. The decoder circuit 35a is enabled with a program cycle signal EN, and decodes an external command signal ADDm and ADDn transferred from predetermined address pins of the address port 36 in the programming mode.

Figure 4:
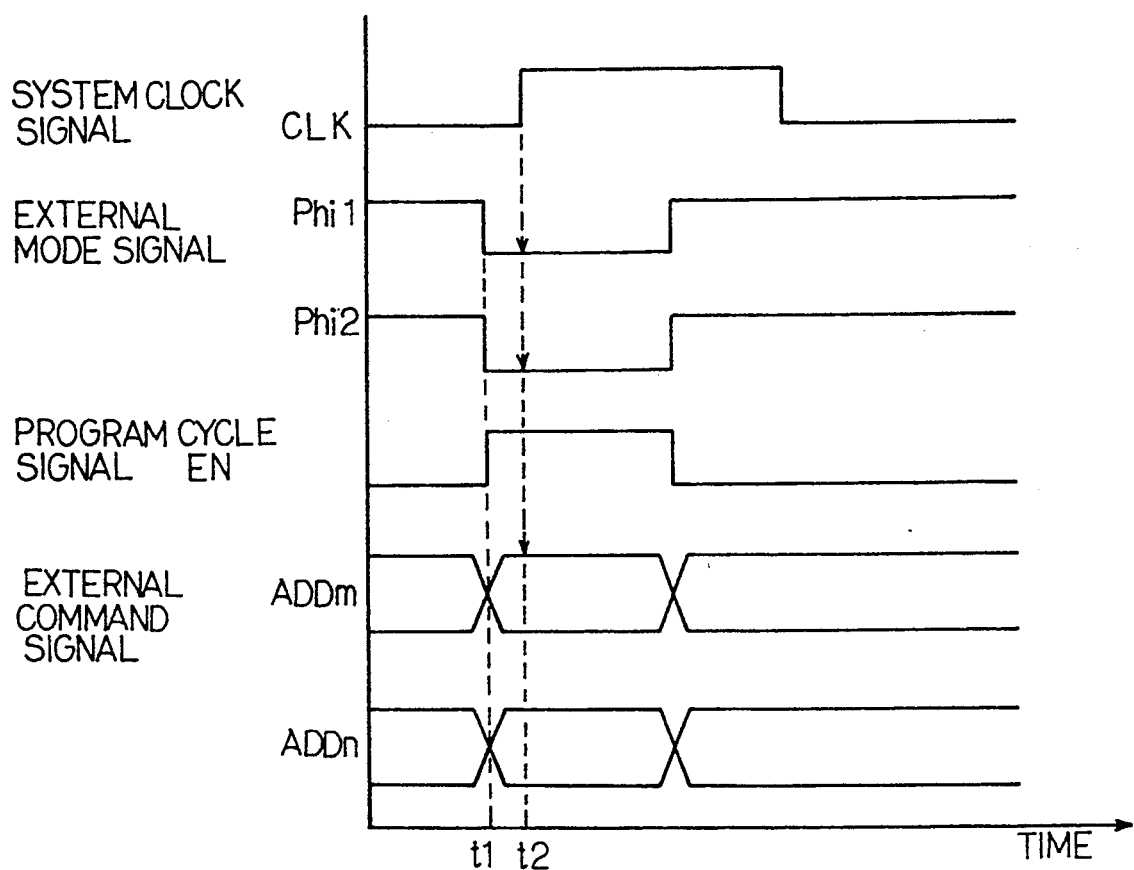
FIG. 4 is a timing chart showing a sequence of a programming mode.

FIG. 4 illustrates the programming mode. If two bits phi1 and phi2 of an external mode signal concurrently go down at time t1, the ROM table 34a acknowledges the programming mode, and produces the program cycle signal EN. With the program cycle signal EN, the decoder circuits 34a are enabled, and are responsive to the external command signal ADDm and ADDn. The external command signal ADDm and ADDn are decoded by the decoder circuits 34a, and three-bit decoded signals DS are respectively latched by the register circuits 34b at the leading edge of the system clock signal CLK at time t2. The register circuits continuously produces three output bits MODE(3f), MODE(2f) and MODE(1f), and supplies them to the AND gates AD1, AD2 and AD3. If the system clock signal CLK is adjusted to 100 MHz, the external command signal causes the register circuit 34b to shift the bit MODE(3f) to logic "1" level, and the latch control signals CTL1, CTL2, CTL3, CTL4 and CTL5 are varied in synchronism with the highest system clock signal CLK(3f). If the system clock signal CLK is adjusted to 66.6 MHz, the register circuit 34b shifts the bit MODE(2f) to logic "1" level, and the latch control signals CTL3, CTL4 and CTL5 are varied in synchronism with the system clock signal CLK(2f). If the system clock CLK is adjusted to 33.3 MHz, the register circuit 34b shifts the bit MODE (1f) to logic "1" level, and the latch control signal CTL3 is varied in synchronism with the system clock signal CLK (1f).

Figure 5:
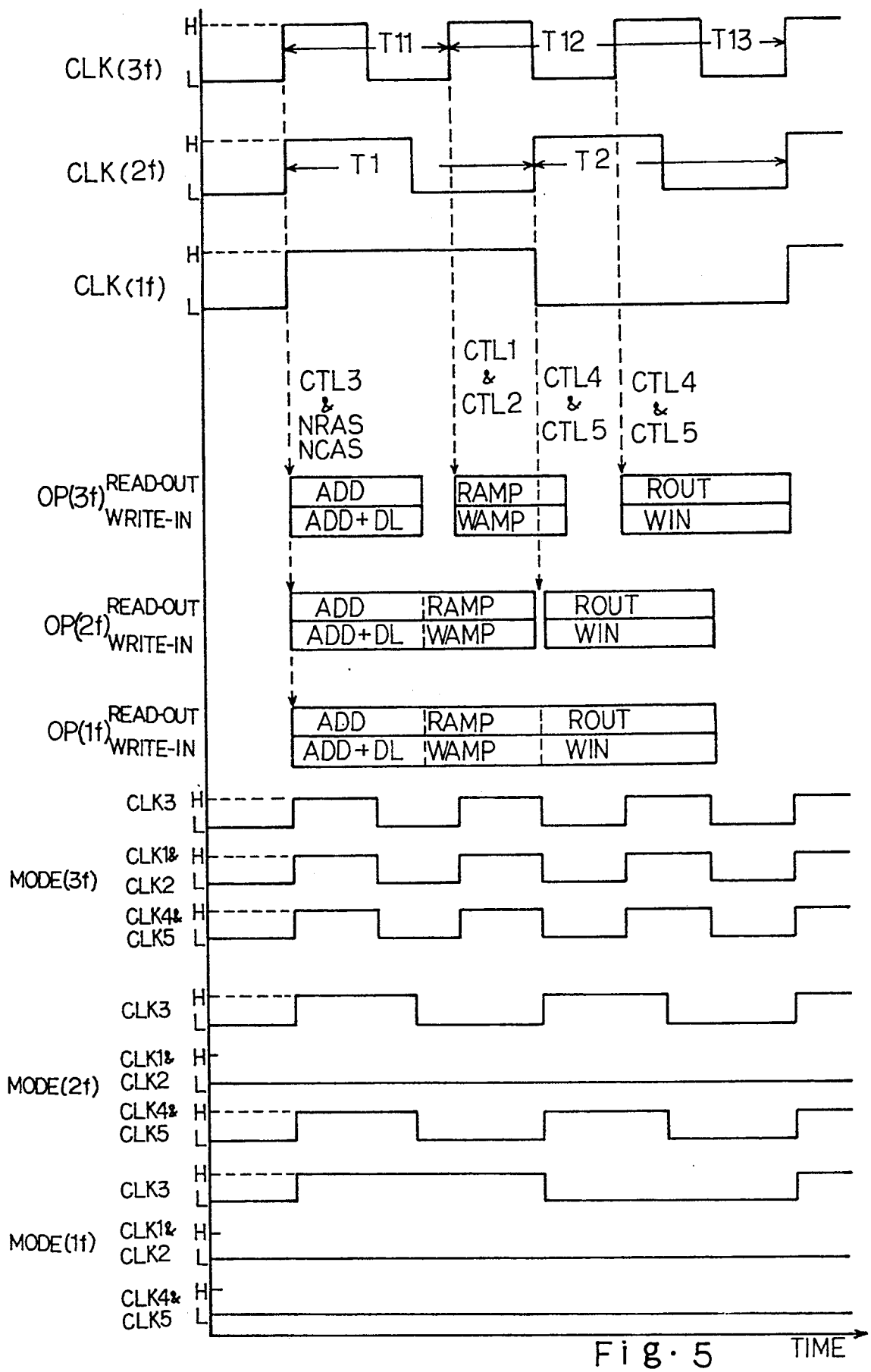
FIG. 5 is a timing chart showing operation sequences at different system clock signals.

Turning to FIG. 5 of the drawings, operating sequences are illustrated at different frequencies CLK(3f), CLK(2f) and CLK(1f). OP(3f), OP(2f) and OP(1f) stand for the operating sequences at 100 MHz, the operating sequences at 66.6 MHz and the operating sequences at 33.3 MHz, respectively.

If the external command signal ADDM and ADDn causes the register circuit 34b to produce the bit MODE(1f), the timing generating stages G1, G3 and G5 sequentially supply the internal row address strobe signal NRAS, the internal column address strobe signal NCAS and the latch control signal CTL3 in synchronism with the system clock signal CLK(1f) at 33.3 MHz. However, the latch control signals CTL1, CTL2, CTL4 and CTL5 remain low. While the high-speed dynamic random access memory device enters the read-out mode, the microprocessor 35 can fetch a data bit stored in the memory cell array 31, and the row address signal ADDr and the column address signal ADDc are sequentially latched by the row and column address latch circuits 32a and 32f in the presence of the internal row address strobe signal NRAS and the internal column address strobe signal NCAS. The circuit components of the addressing means 32 sequentially relay the row address information and the column address information toward the driver circuits 32e and 32j without activation of the latch circuits 32d and 32i, and one of the word lines WL1 to WLm and the column selector 32k selects one of the memory cells M11 to Mmn. The read-out data bit is transferred from the associated sense amplifier circuit through the column selector 32k to the read-out amplifier circuit 33b, and the read-out amplifier circuit 33b relays the differential voltage indicative of the readout data bit to the output data buffer circuit 33d without activation of the read-out latch circuit 33c. Finally, the output data buffer circuit 33d produces the output data signal Dout, and the output data signal Dour is supplied to the microprocessor 35. Upon completion of the read-out cycle, the microprocessor can access another data bit, and changes the row and column address signals. In FIG. 5, abbreviation "ADD" stands for the sequence from the supply of the row and column address signals ADDr and ADDc to the decoding at the row and column address decoder circuits 32c and 32h, abbreviation "RAMP" is indicative of the sequence from the driver circuit 32j to the amplification at the read-out amplifier circuit 33b, and abbreviation "ROUT" is representative of the remaining sequence of the read-out operation.

On the other hand, if the microprocessor 35 needs to memorize a data bit in the dynamic random access memory device, the high-speed dynamic random access memory device enters the write-in mode, and the timing generating stages G1, G3 and G5 produces the internal row address strobe signal NRAS and the internal column address strobe signal NCAS and the latch control signal CTL3 in synchronism with the system clock signal CLK(1f). The row and column address signals ADDr and ADDc are sequentially supplied from the microprocessor 35, and are latched by the row and column address latch circuits 32a and 32f. Moreover, the input data signal Din is latched by the data latch circuit 33e in response to the latch control signal CTL3. The row address information and the column address information are sequentially relayed to the driver circuits 32e and 32j without activation of the latch circuits 32d and 32i, and one of the memory cells M11 to Mmn is selected from the memory cell array 31. The write-in data bit indicated by the input data signal Din is relayed from the data latch circuit 33e to the selected memory cell without activation of the write-in latch circuit 33g, and is written into the selected memory cell. After the write-in data bit is stored in the selected memory cell, the microprocessor 35 can start the write-in cycle again. Thus, the operating sequences at 33.3 MHz are similar to those of the prior art dynamic random access memory device. Abbreviation "ADD+DL" is indicative of the sequence "ADD" and the data latch at the latch circuit 33e, abbreviation "WAMP" stands for the production of differential voltage at the write-in data buffer circuit 33f, and abbreviation "WIN" is representative of the remaining operation.

If the microprocessor 35 needs to communicate with the high-speed dynamic random access memory device in synchronism with the system clock signal CLK(2f) at 66.6 MHz, the microprocessor 35 requests the programming mode, and causes the register circuit 34b to shift the bit MODE(2f) to logic "1" level with the external command signal ADDm and ADDn as described hereinbefore. Then, the timing generating stages G1, G3 and G5 to G7 become responsive to the system clock signal CLK(2*f*). However, the timing generating stages G2 and G4 keep the latch control signals CTL1 and CTL2 low. The operating sequences OP(2*f*) are also carried out in the read-out mode and the write-in mode, and the microprocessor 35 repeats the read-out cycle for sequentially fetching data bits and the write-in cycle for writing data bits into the memory cell array 31. Every read-out cycle is completed within a single pulse period of the system clock signal CLK(2*f*), and every write-in cycle is also as long as the single pulse period. Although the timing generating stages G1/G3/G7 or G1/G3/G5/G7 sequentially produce the internal row address strobe signal NRAS, the internal column address strobe signal NCAS and the latch control signal CTL5 or signals CTL3 and CTL4 in every pulse period depending upon the mode, description is focused upon a data stream, and ignores unnecessary latch control signals for the sake of simplicity.

While the microprocessor repeats the read-out cycle, the row and column address signals ADDr and ADDc are sequentially changed in synchronism with the system clock signal CLK(2*f*), and read-out data bits are sequentially supplied to the microprocessor 35 in synchronism with the system clock signal CLK(2*f*). In the first time period T1 equivalent to the pulse period of the system clock signal CLK(2*f*), the first row address signal ADDr and the first column address signal ADDc are latched by the row address latch circuit 32*a* and the column address latch circuit 32*f*, respectively, and the first row address and the first column address are relayed to the row address decoder circuit 32*c* and the column address decoder circuit 32*h*. The row address decoded signal Drow and the column address decoded signal Dcol cause the driver circuits to select a word line and a bit line pair, and a data bit is read out from a memory cell assigned the first row address and the first column address. Then, a differential voltage indicative of the first read-out data bit reaches the read-out latch circuit 33*c*. Therefore, the sequences ADD and RAMP are completed within the first time period.

While the system clock signal CLK(2*f*) stays in the second time period T2, the output data signal Dour is produced from the differential voltage indicative of the first read-out data bit, and a second read-out data bit is read out from another memory cell assigned a second row address and a second column address in parallel to the production of the output data signal Dour. In detail, the timing generating stages G1, G3 and G7 produces the internal row address strobe signal NRAS, the internal column address strobe signal NCAS and the latch control signal CTL5, and the second row address signal ADDr, the second column address signal ADDc and the differential voltage indicative of the first read-out data bit are respectively latched by the row address latch circuit 32*a*, the column address latch circuit 32*f* and the read-out latch circuit 33*c*. The output data buffer circuit 33*d* produces the output data signal Dour indicative of the first read-out data bit from the differential voltage stored in the read-out latch circuit 33*c*, and the output data signal Dour is supplied from the data output port 37 to the microprocessor 35. On the other hand, the second row address and the second column address are relayed to the row address decoder circuit 32*c* and the column address decoder circuit 32*h*, and the row address decoded signal Drow and the column address decoded signal Dcol cause the driver circuits 32*e* and 32*j* to select another memory cell assigned the second row address and the second column address from the memory cell array 31. Then, another data bit is read out from the memory cell, and a differential voltage indicative of the second read-out data bit reaches the read-out latch circuit 33*c*. Thus, the sequences ROUT is overlapped with the sequences ADD and RAMP, and read-out data bits are sequentially supplied to the microprocessor 35 in synchronism with the system clock signal CLK(2*f*).

If the microprocessor 35 memorizes data bits in the high-speed dynamic random access memory device, the microprocessor 35 repeats the write-in cycle, and the sequences (ADD+DL) and WAMP and the sequence WIN are sequentially carried out in overlapped manner. In detail, the timing generating stages G1, G3 and G5 produces the internal row address strobe signal NRAS, the internal column address strobe signal NCAS and the latch control signal CTL3 in the first time period T1, and the row address signal ADDr, the column address signal ADDc and the input data signal Din are respectively stored in the row address latch circuit 32*a*, the column address latch circuit 32*f* and the data latch circuit 33*e*. The first row address and the first column address are relayed to the row address decoder circuit 32*c* and the column address decoder circuit 32*h*, and the row address decoded signal Drow and the column address decoded signal Dcol cause the driver circuits 32*e* and 32*j* to select a memory cell assigned the first row address and the first column address. On the other hand, the write-in data buffer circuit 33*f* produces a differential voltage indicative of a first write-in data bit from the input data signal Din stored in the data latch circuit 33*e*, and the differential voltage reaches the write-in latch circuit 33*g*.

In the second time period T2, the write-in latch circuit 33*g* stores the differential voltage indicative of the first write-in data bit in response to the latch control signal CTL4, and the first write-in data bit is memorized in the selected memory cell. While the system clock signal CLK(2*f*) stays in the second time period T2, the microprocessor 35 supplies the row and column address signals ADDr and ADDc indicative of the second row address and the second column address and the input data signal Din indicative of the second write-in data bit to the high-speed dynamic random access memory device, and the sequences (ADD+DL) and WAMP are carried out together with the sequence WIN. Thus, the sequences (ADD+DL) and WAMP and the sequence WIN are overlapped, and the write-in data bits are memorized in synchronism with the system clock signal CLK(2*f*).

If the microprocessor 35 needs to communicate with the high-speed dynamic random access memory device in synchronism with the system clock signal CLK(3*f*) at 100 MHz, the microprocessor 35 requests the programming mode, and causes the register circuit 34*b* to shift the bit MODE(3*f*) to logic "1" level with the external command signal ADDm and ADDn as described hereinbefore. Then, the timing generating stages G1 to G7 become responsive to the system clock signal CLK(3*f*). The operating sequences OP(3*f*) are also carried out in the read-out mode and the write-in mode, and the microprocessor 35 repeats the read-out cycle for sequentially fetching data bits and the write-in cycle for writing data bits into the memory cell array 31.

While the microprocessor 35 repeats the read-out cycle, the row and column address signals ADDr and ADDc are sequentially changed in synchronism with the system clock signal CLK(3*f*), and read-out data bits are also sequentially supplied to the microprocessor 35 in synchronism with the system clock signal CLK(3f). In the first time period T1 equivalent to the pulse period of the system clock signal CLK(3f), the first row address signal ADDr and the first column address signal ADDc are latched by the row address latch circuit 32a and the column address latch circuit 32f, respectively, and the first row address and the first column address are relayed to the row address decoder circuit 32c and the column address decoder circuit 32h. The row address decoder circuit 32c and the column address decoder circuit 32h produce the row address decoded signal Drow and the column address decoded signal Dcol, and the row address decoded signal Drow and the column address decoded signal Dcol reach the latch circuits 32d and 32i, respectively.

In the second time period T12, the sequence ADD and the sequence RAMP are simultaneously carried out in overlapped manner. Namely, the latch circuits 32d and 32i store the row address decoded signal Drow and the column address decoded signal Dcol in response to the latch control signals CTL1 and CTL2, and the second row address signal ADDr indicative of the second row address and the second column address signal ADDc indicative of the second column address are latched by the row address latch circuit 32a and the column address latch circuit 32f, respectively. The row address decoded signal Drow and the column address decoded signal Dcol cause the driver circuits 32e and 32j to select a memory cell assigned the first row address and the first column address, and a data bit is read out from the memory cell. The row address decoded signal Drow indicative of the second row address and the column address decoded signal Dcol indicative of the second column address reach the latch circuits 32d and 32i, and a differential voltage indicative of the first read-out data bit reaches the read-out latch circuit 33c. Therefore, the sequences ADD and RAMP are completed within the first time period.

While the system clock signal CLK(3f) stays in the third time period T13, the sequences ADD, RAMP and ROUT are simultaneously carried out in overlapped manner. The output data signal Dout is stored in the read-out latch circuit 33c in response to the latch control signal CTL5, and the output data buffer circuit 33d produces the output data signal Dout indicative of the first read-out data bit from the differential voltage stored in the read-out latch circuit 33c. The latch circuits 32d and 32i stores the row address decoded signal Drow and the column address decoded signal Dcol in response to the latch control signals CTL1 and CTL2, and the driver circuits 32e and 32j selects another memory cell assigned the second row address and the second column address. Then, a second read-out data bit is read out from another memory cell, and a differential voltage indicative of the second read-out data bit reaches the read-out latch circuit 33c. Moreover, the microprocessor 35 supplies the row address signal ADDr indicative of the third row address and the column address signal ADDc indicative of the third column address, and the row address signal ADDr and the column address signal ADDc are latched by the row address latch circuit 32a and the column address latch circuit 32f in response to the internal row address strobe signal NRAS and the internal column address strobe signal NCAS. The third row address and the third column address are relayed to the row address decoder circuit 32c and the column address decoder circuit 32h, and the row address decoded signal Drow and the column address decoded signal Dcol reach the latch circuits 32d and 32i. Thus, the supply of row and column address signals ADDr and ADDc, the selection of memory cell and the production of output data signal Dout are concurrently carried out in the high-speed dynamic random access memory device, and read-out data bits are sequentially supplied to the microprocessor 35 in synchronism with the system clock signal CLK(3f). If we focus our attention upon a single access, the single access consumes three time periods T11 to T13. However, if we focus our attention upon the data stream, every data bit is read out within a single time period T11, T12 or T13.

If the microprocessor 35 memorizes data bits in the high-speed dynamic random access memory device, the microprocessor 35 repeats the write-in cycle, and the sequences (ADD+DL), WAMP and WIN are sequentially carried out in overlapped manner. In detail, the timing generating stages G1, G3 and G5 produces the internal row address strobe signal NRAS, the internal column address strobe signal NCAS and the latch control signal CTL3 in the first time period T11, and the row address signal ADDr indicative of the first row address, the column address signal ADDc indicative of the first column address and the input data signal Din indicative of the first write-in data bit are respectively stored in the row address latch circuit 32a, the column address latch circuit 32f and the data latch circuit 33e. The first row address and the first column address are relayed to the row address decoder circuit 32c and the column address decoder circuit 32h, and the row address decoder circuit 32c and the column address decoder circuit 32h supply the row address decoded signal Drow and the column address decoded signal Dcol to the latch circuits 32d and 32i. The write-in data buffer circuit 33f produces a differential voltage indicative of the first write-in data bit from the input data signal stored in the data latch circuit 33e. However, the row address decoded signal Drow, the column address decoded signal Dcol and the differential voltage are not latched by the latch circuits 32d, 32i and 33g in this stage.

While staying in the second time period T12, the microprocessor 35 supplies the row address signal ADDr indicative of the second row address, the column address signal ADDc indicative of the second column address and the input data signal Din indicative of the second write-in data bit to the ports 36 and 38, and the timing generating stages G1 to G6 supplies the internal row address strobe signal NRAS, the internal column address strobe signal NCAS and the latch control signals CTL1 to CTL4 to the respective latch circuits 32a, 32d, 32f, 32i, 33e and 33g. The latch circuits 32d and 32i store the row address decoded signal Drow indicative of the first row address and the column address decoded signal Dcol indicative of the first column address in response to the latch control signals CTL1 and CTL2, respectively, and the write-in latch circuit 33g stores the differential voltage indicative of the first write-in data bit in response to the latch control signal CTL4. Moreover, the row address latch circuit 32a, the column address latch circuit 32f and the data latch circuit 33e are responsive to the internal row address strobe signal NRAS, the internal column address strobe signal NCAS and the latch control signal CTL3 for storing the row address signal ADDr indicative of the second row address, the column address signal ADDc indicative of the second column address and the data input signal Din indicative of the second write-in data bit, respectively. The row address decoded signal Drow and the column address decoded signal Dcol cause the driver circuits 32e and 32j to select a memory cell assigned the first row address and the first column address.

In the third time period T13, the microprocessor 35 supplies the row address signal ADDr indicative of the third row address, the column address signal ADDc indicative of the third column address and the input data signal Din indicative of the third write-in data bit to the ports 36 and 38, and the timing generating stages G1 to G6 supplies the internal row address strobe signal NRAS, the internal column address strobe signal NCAS and the latch control signals CTL1 to CTL4 to the respective latch circuits 32a, 32d, 32f, 32i, 33e and 33g again. The driver circuits 32e and 32j have already selected the memory cell assigned the first row address and the first column address, and the first write-in data bit has been also stored in the write-in latch circuit 33g. The differential voltage indicative of the first write-in data bit is twice developed by the write-in amplifier circuit 33h and the sense amplifier circuit, and the first write-in data bit is memorized in the selected memory cell. The latch circuits 32d and 32i store the row address decoded signal Drow indicative of the second row address and the column address decoded signal Dcol indicative of the second column address in response to the latch control signals CTL1 and CTL2, respectively, and the write-in latch circuit 33g stores the differential voltage indicative of the second write-in data bit in response to the latch control signal CTL4. Moreover, the row address latch circuit 32a, the column address latch circuit 32f and the data latch circuit 33e are responsive to the internal row address strobe signal NRAS, the internal column address strobe signal NCAS and the latch control signal CTL3 for storing the row address signal ADDr indicative of the third row address, the column address signal ADDc indicative of the third column address and the data input signal Din indicative of the third write-in data bit, respectively. The row address decoded signal Drow and the column address decoded signal Dcol cause the driver circuits 32e and 32j to select a memory cell assigned the second row address and the second column address.

Though not shown in FIG. 5, the second write-in data bit is memorized in the selected memory cell in the next time period, and the fourth row and column addresses and the fourth write-in data bit are respectively memorized in the latch circuits 32a, 32f and 33e in the same time period. Thus, the sequences ADD+DL, WAMP and WIN are overlapped with one another in every time period, and the microprocessor 35 causes the high-speed dynamic random access memory device to memorize every write-in data bit within a single time period.

Second Embodiment

Figure 6:
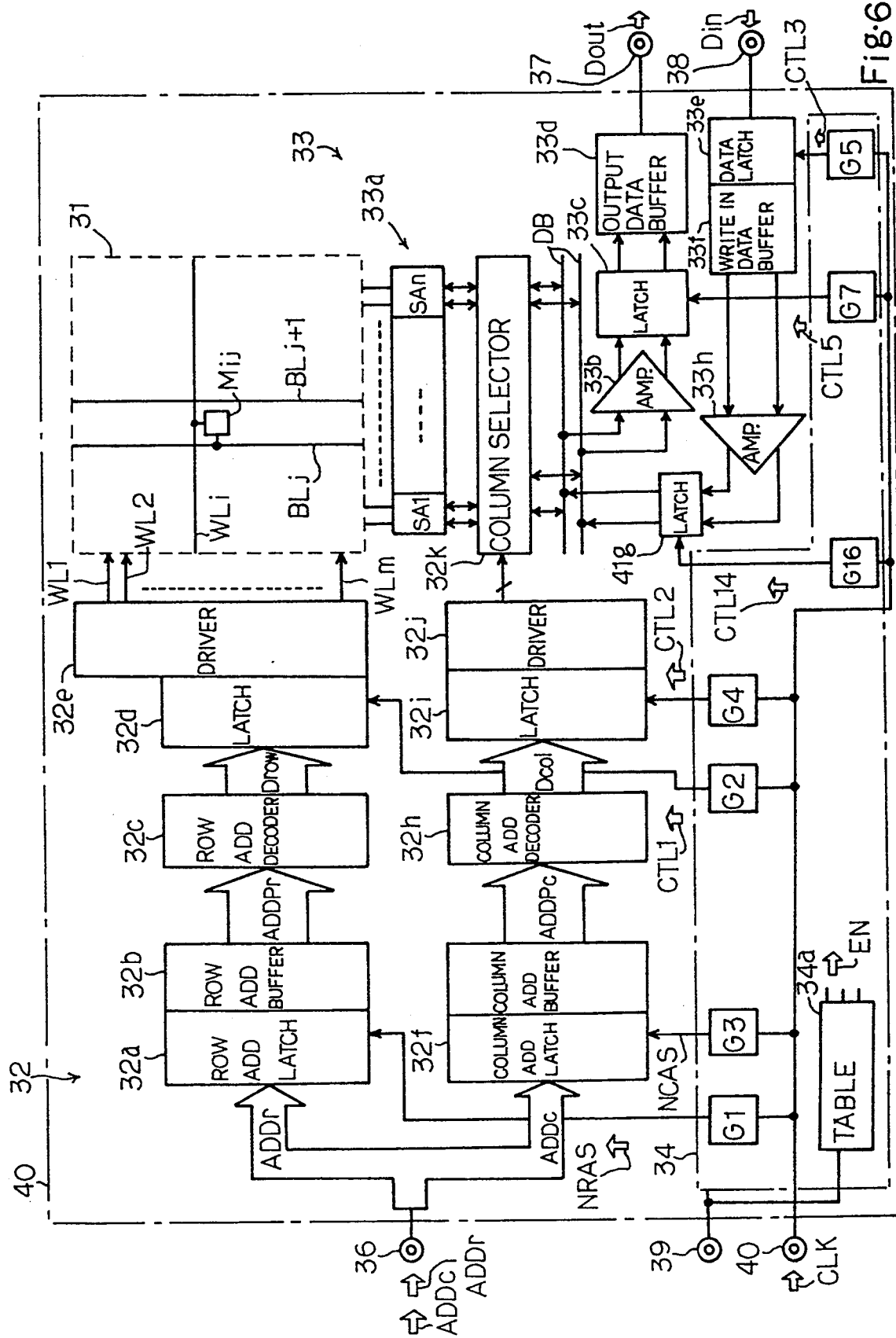
FIG. 6 is a block diagram showing the arrangement of another high-speed dynamic random access memory device according to the present invention.

Turning to FIG. 6 of the drawings, another high-speed dynamic random access memory device is fabricated on a single semiconductor chip 40. Comparing the high-speed dynamic random access memory device shown in FIG. 6 with the first embodiment, the write-in latch circuit 33g and the timing generating stage G6 are deleted, and a latch circuit 41g and a timing generating stage G16 are newly added. However, the other circuit arrangement is similar to the first embodiment, and the other circuits of the second embodiment are labeled with the same references designating the corresponding circuits without detailed description.

In this instance, a differential voltage indicative of a write-in data bit is latched by the latch circuit 41g in response to a latch control signal CTL14 after development by the write-in amplifier circuit 33h. This is because of the fact that the component circuits are operable at different speeds from those of the first embodiment, and the temporal storage after the development is appropriate for the second embodiment rather than the write-in latch circuit 33g.

As will be appreciated from the foregoing description, the high-speed dynamic random access memory device according to the present invention is equipped with temporary storages in the data propagation path and the address propagation path, and sequentially relays address information and data information like a pipeline architecture, thereby effectively decreasing the access time.

Although particular embodiments of the present invention have been shown and described, it will be obvious to those skilled in the art that various changes and modifications may be made without departing from the spirit and scope of the present invention. For example, the latch circuits are movable to appropriate locations in the address propagation path as well as in the data propagation path in consideration of address and data propagating speeds, and another high-speed dynamic random access memory device may have more than one temporary address storage in the address propagating path and more than one temporary data storage in the data propagation path.

What is claimed is:

1. A dynamic random access memory device fabricated on a semiconductor chip, comprising:
   a) a memory cell array having a plurality of memory cells arranged in rows and columns, row addresses and column addresses being respectively assigned to said rows and said columns;
   b) a row addressing means having a row address latch circuit responsive to an internal row address strobe signal for temporarily storing an external row address signal, a row address decoder unit for producing a row address decoded signal from said external row address signal, and a word line driver circuit responsive to said row address decoded signal for selecting a row of memory cells indicated by said external row address signal;
   c) a column addressing means having a column address latch circuit responsive to an internal column address strobe signal for temporarily storing an external column address signal, a column address decoder unit for producing an internal column address decoded signal from said external column address signal, and a column selecting unit responsive to said column address decoded signal for selecting a column of memory cells indicated by said external column address signal;
   d) a data transferring means inserted between a data input/output means and said memory cell array for providing a data path between said data input/output means and one of said plurality of memory cells indicated by said external row address signal and said external column address signal, and having a first temporary data storage coupled with said data input/output means and responsive to a first control signal for storing an external data signal, a second temporary data storage responsive to a second control signal for storing a first differential voltage produced from said external data signal and a third temporary data storage responsive to a third control signal for storing a second differential voltage indicative of a read-out data bit supplied from said memory cell array, said second temporary data storage transferring said first differential voltage in an absence of said second control signal, said third temporary data storage transferring said second differential voltage in an absence of said third control signal; and e) a controlling means having a plurality of timing generating stages operative to produce said internal row address strobe signal, said internal column address strobe signal, said first control signal, said second control signal and said third control signal in synchronism with an external clock signal, said row addressing means further having a first temporary address storage responsive to a fourth control signal for storing said row address decoded signal, said column addressing means further having a second temporary address storage responsive to a fifth control signal for storing said internal column address decoded signal, said first temporary address storage transferring said row address decoded signal in an absence of said fourth control signal, said second temporary address storage transferring said column address decoded signal in an absence of said fifth control signal, said controlling means further having a timing generating stages for producing said fourth control signal and said fifth control signal in synchronism with said external clock signal, and a programming circuit responsive to an external command signal for enabling the timing generating stages operative to produce said internal row address stobe signal, said internal column address strobe signal and only said first control signal, or for enabling the timing generating stages operative to produce said internal row address strobe signal, said internal column address strobe signal and only said first to third control signals.

2. A dynamic random access memory device as set forth in claim 1, in which said second temporary data storage is coupled between a write-in data buffer circuit and a write-in amplifier circuit.

3. A dynamic random access memory device as set forth in claim 2, in which said third temporary data storage is coupled between a read-out amplifier circuit and an output data buffer circuit.

4. A dynamic random access memory device as set forth in claim 1, in which said second temporary data storage is coupled between a write-in amplifier circuit and a common data bus.

5. A dynamic random access memory device as set forth in claim 4, in which said third temporary data storage is coupled between a read-out amplifier circuit and an output data buffer circuit.

6. A computer system controlled by a system clock signal, comprising:

a) a dynamic random access memory device comprising a-1) a memory cell array having a plurality of memory cells arranged in rows and columns, row addresses and column addresses being respectively assigned to said rows and said columns;

a-2) a row addressing means having a row address latch circuit responsive to an internal row address strobe signal for temporarily storing an external row address signal, a row address decoder unit for producing a row address decoded signal from said external row address signal, a first temporary address storage responsive to a first control signal for storing said row address decoded signal, and a word line driver circuit responsive to said row address decoded signal for selecting a row of memory cells indicated by said external row address signal;

a-3) a column addressing means having a column address latch circuit responsive to an internal column address strobe signal for temporarily storing an external column address signal, a column address decoder unit for producing an internal column address decoded signal from said external column address signal, a second temporary address storage responsive to a second control signal for storing said internal column address decoded signal, and a column selecting unit responsive to said column address decoded signal for selecting a column of memory cells indicated by said external column address signal, a-4) a data transferring means inserted between a data input/output means and said memory cell array for providing a data path between said data input/output means and one of said plurality of memory cells indicated by said external row address signal and said external column address signal, and having a first temporary data storage coupled with said data input/output means and responsive to a third control signal for storing an external data signal, a second temporary data storage responsive to a fourth control signal for storing a first differential voltage produced from said external data signal and a third temporary data storage responsive to a fifth control signal for storing a second differential voltage indicative of a read-out data bit supplied from said memory cell array, and a-5) a controlling means having a plurality of timing generating stages operative to produce said internal row address strobe signal, said internal column address strobe signal, said first control signal, said second control signal, said third control signal, said fourth control signal and said fifth control signal in synchronism with said system clock signal, and a programming circuit responsive to an external command signal for disabling only the timing generating stages that produce said first and second control signals or only the timing generating stages operative to produce said first, second, fourth, and fifth control signals; and b) a microprocessor communicable with said dynamic random access memory device, and having at least a read-out cycle for fetching a data bit stored in said memory cell array and a write-in cycle for rewriting a data bit stored in said memory cell array, said system clock signal defining said read-out cycle and said write-in cycle.

* * * * *

UNITED STATES PATENT AND TRADEMARK OFFICE
CERTIFICATE OF CORRECTION

PATENT NO. : 5,341,341

DATED : August 23, 1994

INVENTOR(S) : FUKUZO

It is certified that error appears in the above-indentified patent and that said Letters Patent is hereby corrected as shown below:

Col. 2, line 23, delete "I 5" and insert --15--.

Col. 5, line 66, delete "Dour" and insert --Dout--.

Col. 6, line 42, delete "ADDPt" and insert --ADDPr--.

Col. 8, line 38, delete "Dour" and insert --Dout--.

Col. 9, line 52, delete "ADDM" and insert --ADDm--.

Col. 10, line 15, delete "Dour" and insert --Dout--.

Col. 11, line 42, delete "Dour" and insert --Dout--.

Col. 11, line 47, delete "Dour" and insert --Dout--.

Col. 11, line 57, delete "Dour" and insert --Dout--.

Col. 11, line 60, delete "Dour" and insert --Dout--.

Signed and Sealed this

Seventh Day of March, 1995

Attest:

BRUCE LEHMAN

*Attesting Officer*   *Commissioner of Patents and Trademarks*